(12) United States Patent
Kobayashi

(10) Patent No.: US 6,369,440 B1
(45) Date of Patent: Apr. 9, 2002

(54) SEMICONDUCTOR SUBSTRATE AND MANUFACTURING METHOD THEREOF

(75) Inventor: Harufumi Kobayashi, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/265,406

(22) Filed: Mar. 10, 1999

(30) Foreign Application Priority Data

Mar. 12, 1998 (JP) .......................................... 10-061143

(51) Int. Cl.[7] .................... H01L 23/12; H01L 23/48; H01L 29/52; H01L 29/40
(52) U.S. Cl. ................. 257/672; 257/670; 257/676; 257/674; 257/698; 257/666; 257/497; 257/675
(58) Field of Search ................. 257/678, 696, 257/698, 692, 693, 666, 669–672, 674, 676, 684, 497, 675

(56) References Cited

U.S. PATENT DOCUMENTS

| | | | | |
|---|---|---|---|---|
| 4,048,438 A | * | 9/1977 | Zimmerman ................. 29/625 |
| 5,294,827 A | * | 3/1994 | McShane ..................... 257/666 |
| 5,304,818 A | * | 4/1994 | Go ............................... 257/669 |
| 5,309,018 A | * | 5/1994 | Shibata ........................ 257/666 |
| 5,457,341 A | * | 10/1995 | West ............................ 257/666 |
| 5,691,242 A | * | 11/1997 | Nomi et al. |
| 5,753,974 A | * | 5/1998 | Masukawa ................... 257/737 |
| 6,019,274 A | * | 2/2000 | Iwamoto ................. 228/180.21 |
| 6,081,029 A | * | 6/2000 | Yamaguchi ................. 257/666 |

FOREIGN PATENT DOCUMENTS

| | | | |
|---|---|---|---|
| JP | 57-141947 | * | 9/1982 |
| JP | 61-39558 | * | 2/1986 |
| JP | 11-260951 | * | 9/1999 |

* cited by examiner

*Primary Examiner*—Alexander O. Williams
(74) *Attorney, Agent, or Firm*—Rabin & Berdo, P.C.

(57) ABSTRACT

A semiconductor apparatus substrate according to the present invention has a substrate, a piece-substrate that has been punched out of the substrate and pushed back to the original position, an opening unit formed in a region of the substrate that substantially surrounds the piece-substrate, and a support unit installed inside the opening unit. As a result of this configuration, in transporting the semiconductor apparatus substrate after the piece-substrate has been pushed back, the piece-substrate is prevented from falling off the semiconductor apparatus substrate.

20 Claims, 8 Drawing Sheets

SEMICONDUCTOR SUBSTRATE AND MANUFACTURING METHOD THEREOF

BACKGROUND OF THE INVENTION

The present invention relates to a push-back substrate, a semiconductor apparatus in which a push-back substrate is used, and the manufacturing method of a push-back substrate.

The Japanese Patent Application Laid-Open No. H8-32185 discloses a conventional technology in this field.

In this reference, a push-back substrate is disclosed. Here, the term push-back refers to a technique for obtaining a piece-substrate that is used for manufacturing a semiconductor apparatus or the like. This technique is performed as follows. First, a prescribed portion of a substrate is punched to obtain a piece-substrate. An opening is created after the piece-substrate is removed. The piece-substrate is then pushed back into the opening to form a piece-substrate to be used for manufacturing a semiconductor apparatus or the like.

SUMMARY OF THE INVENTION

It is an object of the present invention to obtain a semiconductor apparatus substrate capable of preventing a pushed-back piece-substrate from being detached from the semiconductor apparatus substrate.

To achieve the above-stated objective, a semiconductor apparatus substrate according to the present invention has a substrate, a piece-substrate that has been punched out of the substrate and pushed back to the original position, an opening unit formed in a region of the substrate that substantially surrounds the piece-substrate, and a support unit installed inside the opening unit.

DETAILED DESCRIPTION OF THE INVENTION

Figure 1:
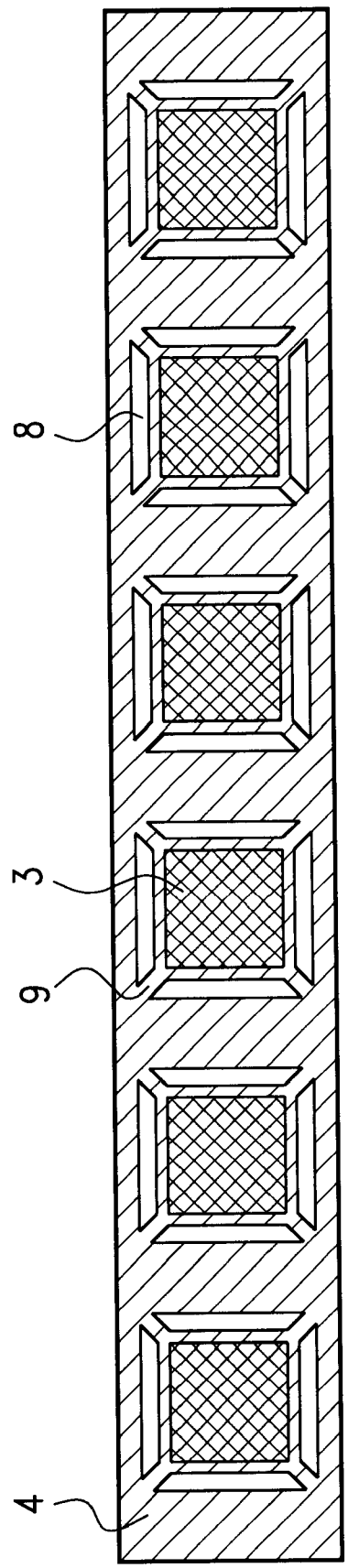
FIG. 1 is a top view showing the first embodiment of the present invention.
Figure 2:
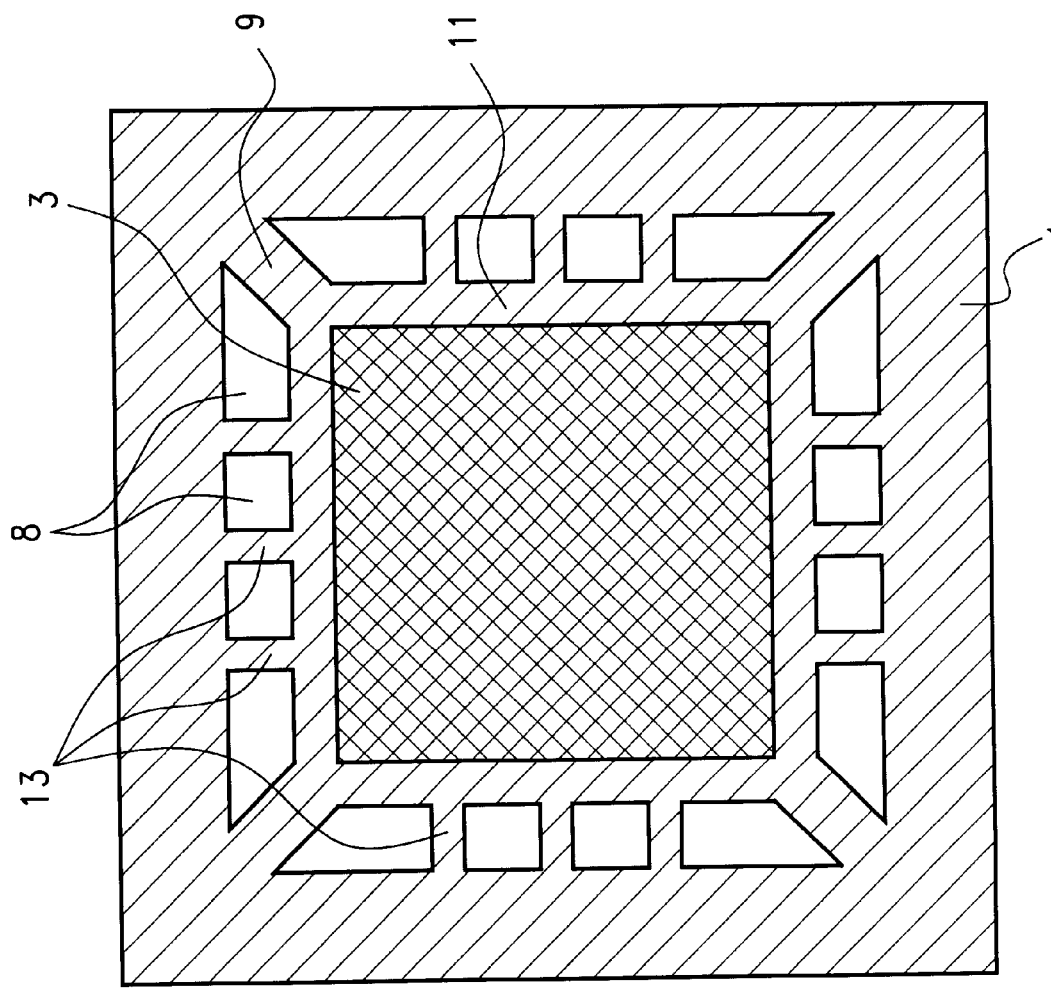
FIG. 2 is a magnified view of one of the substrate pieces shown in FIG. 1.

FIGS. 1 and 2 are top views showing the first embodiment of the present invention. FIG. 1 shows the entire substrate. FIG. 2 is a magnified view of one of the substrate pieces shown in FIG. 1.

In FIG. 2, the piece-substrate 3 has been punched out of the resin substrate 4, pushed back and returned to the resin substrate 4.

Slits 8 are formed along each side of the substrate piece 3 in the peripheral portion of the piece-substrate 3 in the frame of the substrate 4. A suspending unit 9 is formed at each corner of the piece-substrate 3 to support the piece-substrate 3. A frame unit 11 is formed surrounding the piece-substrate 3.

Support bars 13 are formed crossing the slits 8. These support bars 13 are linearly shaped. In FIG. 2, three support bars 13 are formed on each side of the piece-substrate 3, although in alternative embodiments (not shown) only one support bar 13 may be formed on each side of the piece-substrate 3.

These support bars 13 are formed when the piece-substrates 3 and the slits 8 are punched out of the resin substrate 4 leaving the support bars 13, the suspending unit 9, and the frame unit 11.

Figure 8:
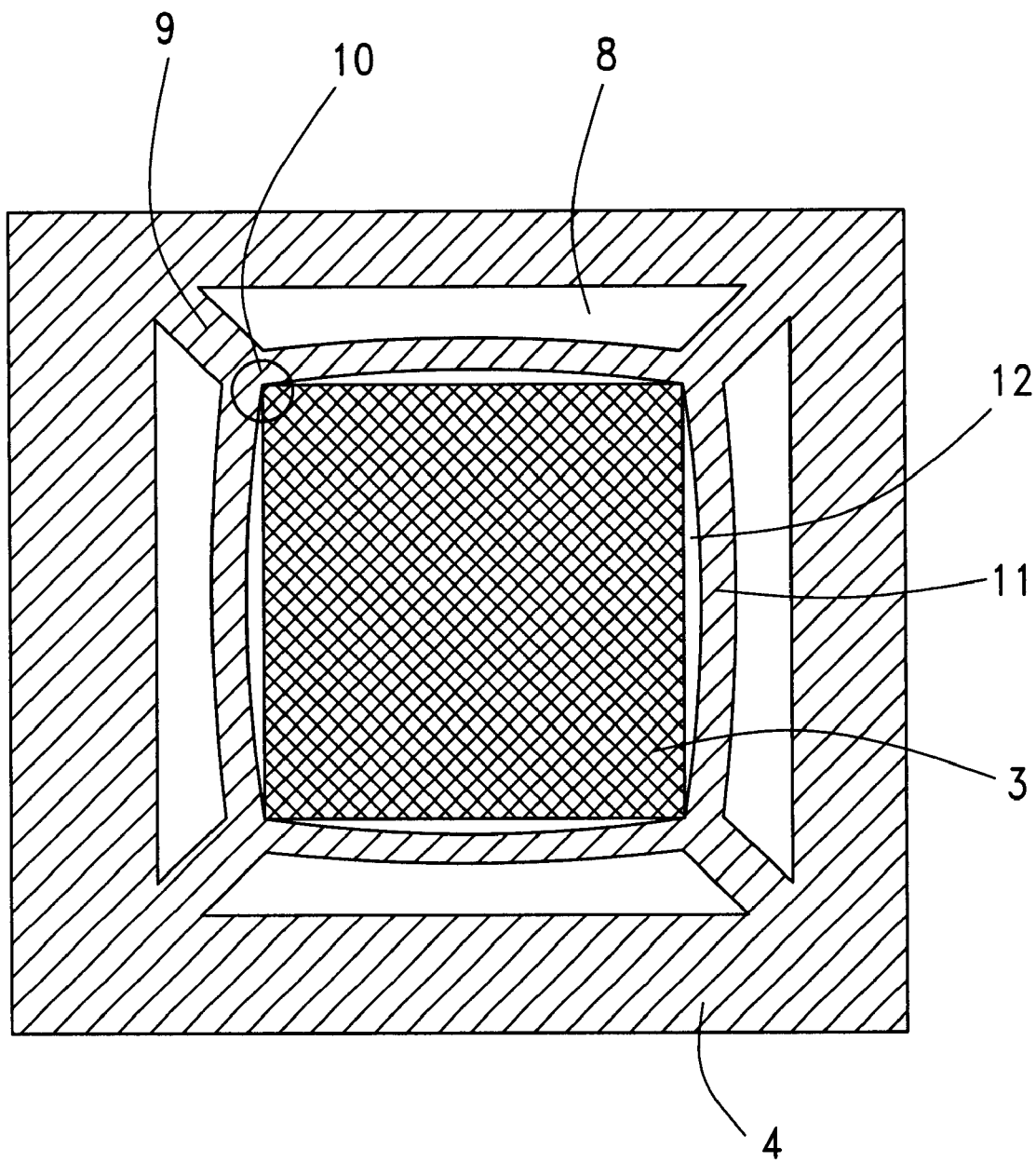
FIG. 8 shows problems of the conventional technology.

FIG. 8 shows a case in which no support bar is formed. Since there is no support bar between the frame unit 11 and the frame of the resin substrate 4 in this case, each side of the frame unit 11 is curved outward creating a gap 12 between the frame unit 11 and the frame of the resin substrate 4. By forming at least one support bar 13 across each slit 8 along each side of the piece-substrate 3 in this manner, the frame unit 11 is pushed by the support bars 13 when the piece-substrate 3 is pushed back and supported by the frame of the resin substrate 4. Therefore, no gap is created between the frame unit 11 and the frame of the resin substrate 4.

The number of support bars 13 are determined taking into consideration the manner in which gaps are generated and the width of the support bars 13.

Thus, according to the first embodiment, a gap is prevented from being created between the frame unit 11 and the frame of the substrate 4 by forming support bars 13 between the frame unit 11 and the frame of the resin substrate 4 across each of the slits 8. As a result, the piece-substrate 3 can be firmly held with the frame of the resin substrate 4.

Therefore, in transporting or assembling the semiconductor apparatus substrate, the piece-substrates 3 are prevented from falling off the semiconductor apparatus substrate.

With reference to FIG. 3, a method for manufacturing a semiconductor apparatus using the resin substrate 4 thus formed will be explained.

Figure 3A:
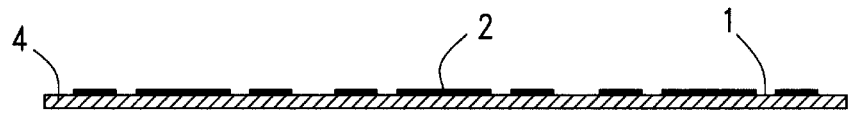
FIG. 3 shows a manufacturing method of a semiconductor apparatus according to the present invention.

First, as shown in FIG. 3(a), a wire 2 is formed in a predetermined area of the resin substrate 4. This wire 2 can be formed, for example, by sticking a copper film or the like onto the resin substrate 4 and patterning the wire 2.

Figure 3B:
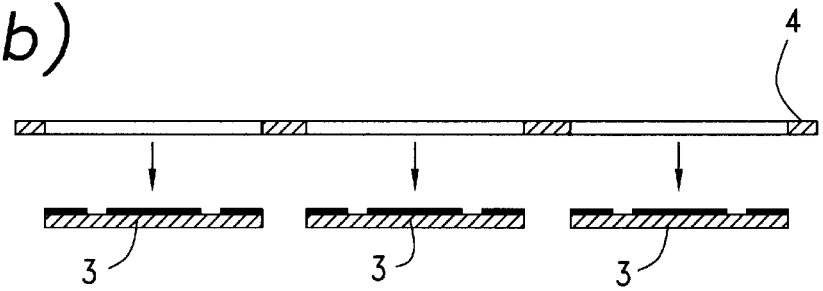
Figure 3C:
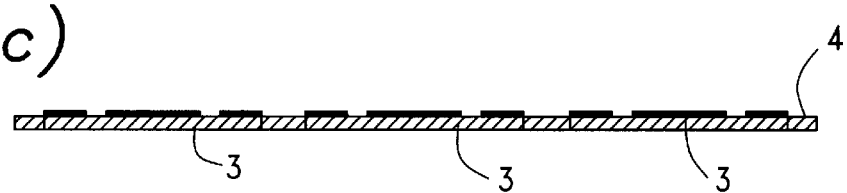

Next, as shown in FIG. 3(b), prescribed portions of the resin substrate 4 are punched to obtain piece-substrates 3. After this, as shown in FIG. 3(c), the piece-substrates 3 are pushed back to their original positions.

Figure 3D:
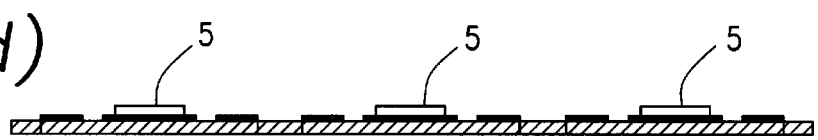
Figure 3E:
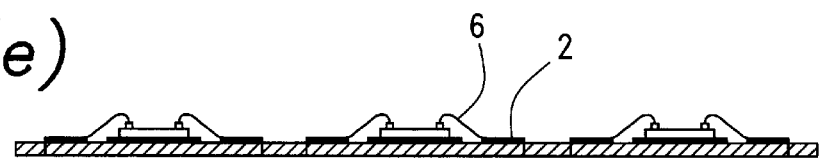

Next, as shown in FIG. 3(d), a semiconductor device 5 is placed on each of the piece-substrates 3. After this, as shown in FIG. 3(e), the electrodes of each of the semiconductor devices 5 are electrically connected to the wire 2 using conductive wires 6.

Figure 3F:
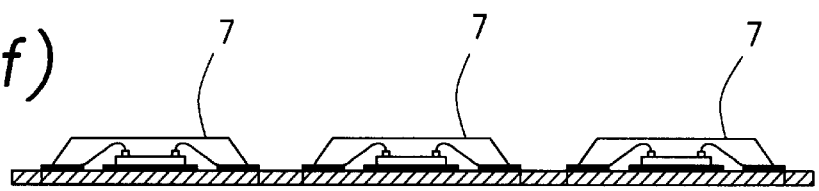

After this, as shown in FIG. 3(f), within the region of each of the piece-substrates 3, the semiconductor device 5 and the conductive wire 6 are sealed with a resin 7.

Figure 3G:
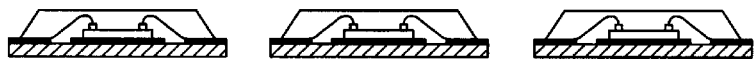

After this, as shown in FIG. 3(g), each of the piece-substrates 3, on which the semiconductor device 5 is formed and sealed, is removed from the resin substrate 4.

In this case, since the piece-substrates 3 are fixed on the resin substrate 4 after being punched out of the resin substrate 4 and pushed back into the resin substrate 4, the piece-substrates 3 can be easily removed from the resin substrate 4 without requiring any particular apparatus.

The following variations of the first embodiment are possible.

Figure 4:
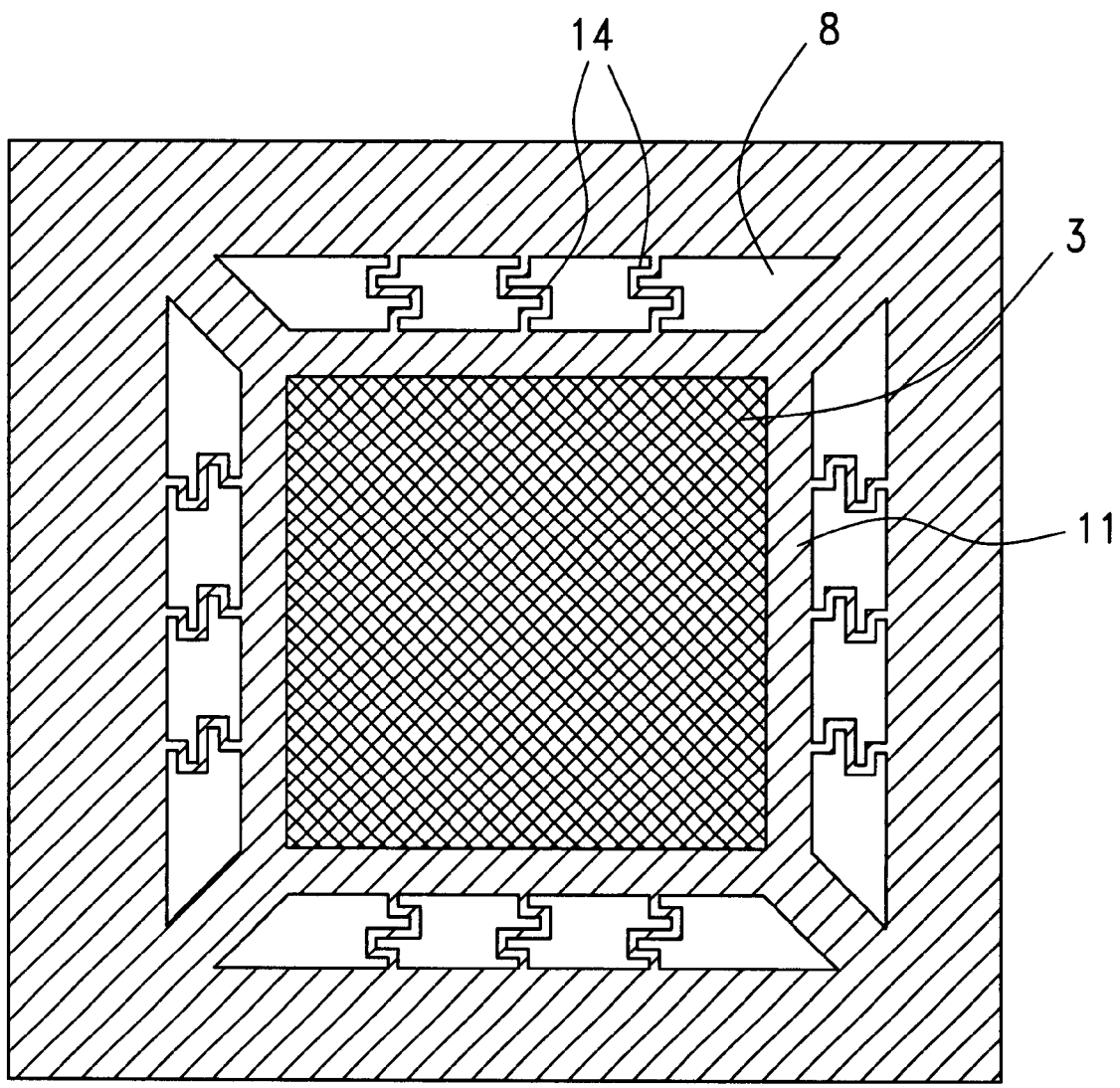
FIG. 4 shows a variation of the first embodiment of the present invention.

As shown in FIG. 4, it is possible to use bent support bars 14. Since such bent support bars have elasticity, they can elastically push back the frame unit 11.

Figure 5:
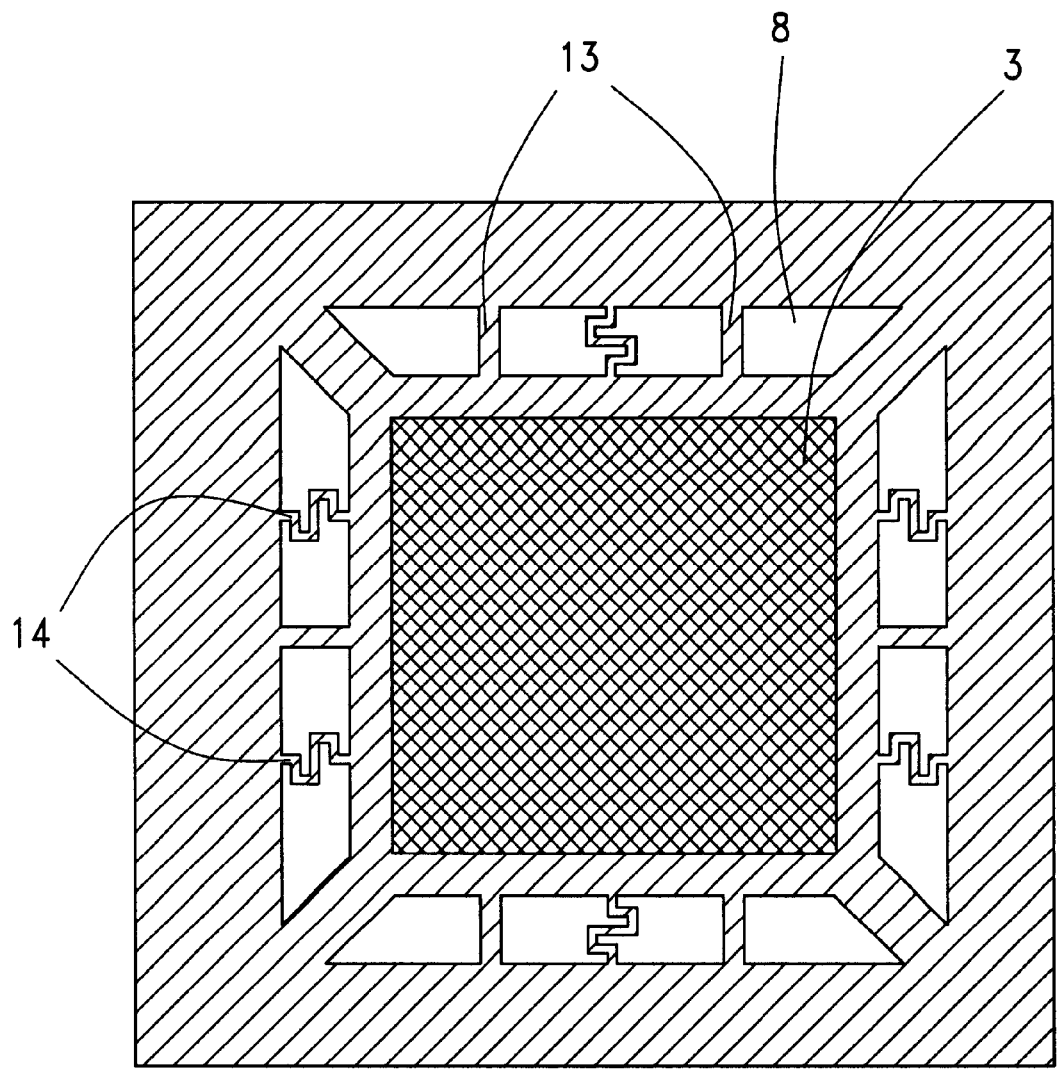
FIG. 5 shows a variation of the second embodiment of the present invention.

As another variation of the first embodiment, as shown in FIG. 5, linear shaped support bars 13 and bent support bars 14 can be used in combination.

In FIG. 5, each side of the piece-substrate 3 is supported by one bent support bar 14 and two linear shaped support bars 13.

Figure 6:
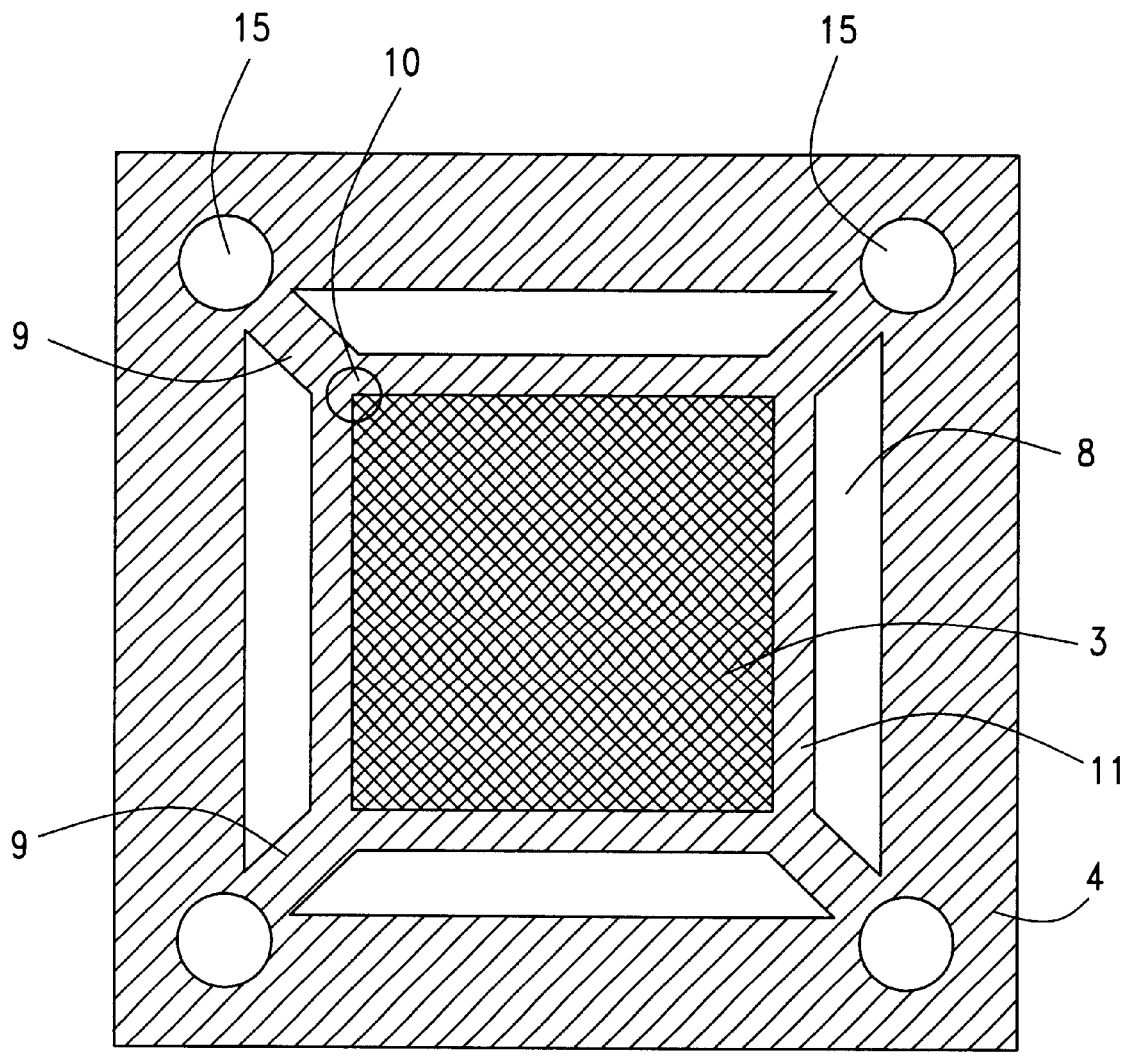
FIG. 6 shows the second embodiment of the present invention.

FIG. 6 is a top view showing the second embodiment of the present invention. The second embodiment differs from the first embodiment in that four circular stress relaxing holes 15 are formed on the frame of the resin substrate 4 between the four corners of the resin substrate 4 and the outside ends of the four suspending units 9.

These circular stress relaxing holes 15 can be formed simultaneously when the slits 8 are punched. Four stress relaxing holes 15 are formed on the line of extension of the four suspending units 9 in the example shown in FIG. 6. However, only one stress relaxing hole 15 may be formed at a position at which the maximum stress is applied. Any desired number of stress relaxing holes 15 can be formed.

Each corner 10 of the piece-substrate 3 is in contact with and supported by corresponding one of the suspending units 9. The stress applied to each of the corners 10 is relaxed by the corresponding one of the stress relaxing holes 15. As a result, no gap is created between the piece-substrate 3 and the frame unit 11.

Thus, according to the second embodiment, simply by forming a circular stress relaxing hole 15 on the line of extension of the suspending unit 9, the same effect is achieved as in the first embodiment.

Figure 7:
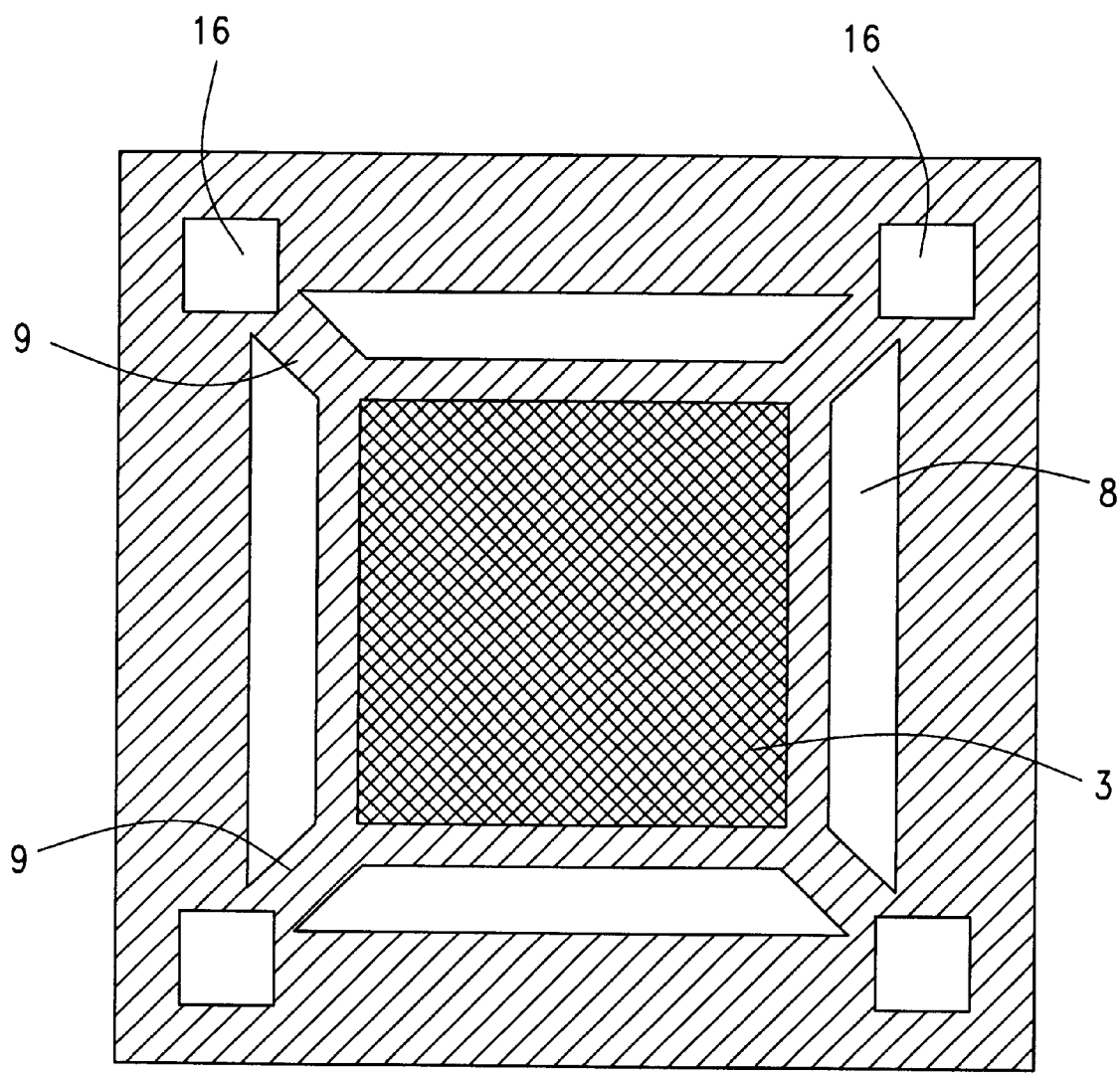
FIG. 7 shows the third embodiment of the present invention.

FIG. 7 is a top view showing the third embodiment of the present invention. FIG. 7 is identical to FIG. 6 except that FIG. 7 differs from FIG. 6 in the shape of each of the stress relaxing holes.

In the third embodiment, the shape of each of the stress relaxing holes 16 formed on the lines of extension of the suspending units 9 is a square. However, the stress relaxing holes 16 may be diamond shaped. Moreover, the stress relaxing holes 16 may be rectangles if they are formed in the mirror symmetry. The third embodiment shows that quadrangular stress relaxing holes 16 are formed.

The stress applied to each of the corners 10 is relaxed by the corresponding one of the quadrangular stress relaxing holes 16. As in the second embodiment, no gap is created between the piece-substrate 3 and the frame unit 11.

It should be noted that when four stress relaxing holes are formed at four positions, circular holes and quadrangular holes may be formed in combination.

For example, a circular hole, a quadrangular hole, a circular hole, and a quadrangular hole may be formed in this order or a circular hole, a circular hole, a quadrangular hole, and a quadrangular hole may be formed in this order at the four positions.

In the explanation above, the support bars and the stress relaxing holes are formed separately. However, they may be combined and formed in the same resin substrate. In this way, it becomes possible to prevent a gap from being created between the piece-substrates 3 and the frame unit 11 more effectively.

Moreover, if a semiconductor apparatus is manufactured using a semiconductor apparatus resin substrate, the piece-substrates are prevented from being detached from the resin substrate in the assembly process or the like. As a result, the production efficiency is improved, and the production cost is reduced.

What is claimed is:

1. A substrate for use in forming a semiconductor apparatus, comprising:
   a substrate;
   a piece-substrate that has been punched out of said substrate and pushed back to an original position so as to be removably held thereat;
   an opening unit formed in a region of said substrate that substantially surrounds said piece-substrate; and
   a support unit formed within said opening unit.

2. A substrate as claimed in claim 1, wherein said support unit is linearly shaped.

3. A substrate as claimed in claim 1, wherein said support unit is non-linear.

4. A substrate for use in forming a semiconductor apparatus, comprising:
   a substrate;
   a piece-substrate that has been punched out of said substrate and pushed back to an original position so as to be removably held thereat;
   a first opening unit formed in a region of said substrate that substantially surrounds said piece-substrate;
   a suspending unit having an end on which said piece-substrate is supported; and
   a second opening unit formed near another end of said suspending unit.

5. A substrate for use in forming a semiconductor apparatus, comprising:
   a substrate;
   a substantially rectangular piece-substrate region that has been punched out of said substrate and pushed back to an original position so as to be removably held thereat,
   an opening unit formed in a region of said substrate that substantially surrounds said piece-substrate region; and
   a first support unit, which crosses said opening unit and supports a corner portion of said piece-substrate region; and
   a second support unit, which crosses said opening unit and supports a peripheral portion of said piece-substrate region.

6. A substrate as claimed in claim 5, wherein a non-linear unit is formed in said second support unit.

7. A substrate for use in forming a semiconductor apparatus, comprising:
   a substrate;
   a substantially rectangular piece-substrate region that has been punched out of said substrate and pushed back to an original position so as to be removably held thereat;
   a first opening unit formed in a region of said substrate that substantially surrounds said piece-substrate region;
   a support unit which crosses said first opening unit and supports a corner portion of said piece-substrate region; and
   a second opening unit formed near an end of said support unit, said support unit extending from said end, across said first opening unit to said piece-substrate region.

8. A substrate as claimed in claim 7, further comprising a second support unit, which supports a peripheral portion of said piece-substrate region.

9. A semiconductor apparatus manufacturing method that uses a substrate as claimed in claim 5, comprising the steps of:
   placing a semiconductor device on said piece-substrate region;

sealing with a resin said semiconductor device on said piece-substrate region; and removing from said substrate said piece-substrate region on which said semiconductor device is sealed with said resin.

10. A semiconductor apparatus manufacturing method that uses a substrate as claimed in claim 7, comprising the steps of:

placing a semiconductor device on said piece-substrate region;

sealing with a resin said semiconductor device on said piece-substrate region; and removing from said substrate said piece-substrate region on which said semiconductor device is sealed with said resin.

11. A semiconductor apparatus manufactured using a substrate as claimed in claim 5, comprising:

a semiconductor device installed on said piece-substrate region; and a sealing resin with which said semiconductor deice is sealed.

12. A substrate device for use in forming a semiconductor device, comprising:

a substrate;

a piece-substrate that has been punched out of the substrate and pushed back to an original position, the substrate having an inner frame, the inner frame surrounding the piece-substrate in abutment with an entire peripheral surface thereof an outer frame surrounding the inner frame; and means, for suspending the inner frame at a plurality of suspension locations about its peripheral surface, within the outer frame, and resisting bowing of the inner frame away from the peripheral surface between the suspension locations.

13. A substrate device for use in forming a semiconductor device, comprising:

a substrate;

a piece-substrate that has been punched out of the substrate and pushed back to an original position so as to be removably held thereat;

an outer frame formed in a region of the substrate that substantially surrounds the piece-substrate;

an inner frame inside the outer frame, the inner frame surrounding the piece-substrate in abutment with an entire peripheral surface of the piece-substrate, so as to provide support therefore;

a suspending unit crossing a space between the inner frame and the outer frame at corners of the inner frame, the suspending unit suspending the inner frame and the piece-substrate inside the outer frame; and means resisting bowing of the inner frame between the inner frame corners away from the peripheral surface of the piece-substrate.

14. A substrate device according to claim 13, wherein the bowling resisting means comprises a plurality of elongated support members spaced apart about the inner frame, each having an inner end connected to inner frame and an outer end connected to the outer frame.

15. An apparatus, comprising:

a first substrate on which a circuit is formed; and a second substrate which has a first frame, a second frame arranged inside the first frame, a plurality of suspending units connecting the first frame and the second frame and a plurality of support bars each arranged between two of the suspending units, wherein the first substrate is arranged inside the second frame.

16. The apparatus according to claim 15, wherein the first frame has four internal corners and the second frame has four external corners, wherein each of the support bars connects a respective one of the external corners to the nearest of the internal corners.

17. The apparatus according to claim 16, wherein each of the support bars is nonlinearly shaped.

18. The apparatus according to claim 16, wherein the first frame has four holes each arranged near a respective one of the internal corners.

19. The apparatus according to claim 18, wherein each hole is either circular or square.

20. The apparatus according to claim 15, wherein the first substrate is a piece-substrate that has been punched out of the second substrate and pushed back to an original position so as to be removably held thereat.

* * * * *